(12) United States Patent
Matsumoto et al.

(10) Patent No.: US 9,944,766 B2
(45) Date of Patent: Apr. 17, 2018

(54) PREPREG, METAL-CLAD LAMINATED BOARD, AND PRINTED WIRING BOARD

(71) Applicant: Panasonic Intellectual Property Management Co., Ltd., Osaka (JP)

(72) Inventors: Masaaki Matsumoto, Fukushima (JP); Takatoshi Mito, Fukushima (JP); Tatuo Yonemoto, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/502,514

(22) PCT Filed: Aug. 21, 2015

(86) PCT No.: PCT/JP2015/004190
§ 371 (c)(1),
(2) Date: Feb. 8, 2017

(87) PCT Pub. No.: WO2016/031205
PCT Pub. Date: Mar. 3, 2016

(65) Prior Publication Data
US 2017/0218150 A1    Aug. 3, 2017

(30) Foreign Application Priority Data
Aug. 27, 2014 (JP) .................. 2014-173144

(51) Int. Cl.
*C08J 5/24* (2006.01)
*C09D 163/00* (2006.01)
(Continued)

(52) U.S. Cl.
CPC .................. *C08J 5/24* (2013.01); *B32B 15/08* (2013.01); *C09D 163/00* (2013.01);
(Continued)

(58) Field of Classification Search
CPC .. H05K 1/0366; H05K 1/0373; H05K 1/0353; C08J 5/24
See application file for complete search history.

(56) References Cited

U.S. PATENT DOCUMENTS

2011/0007489 A1* 1/2011 Ohigashi ............ C08G 59/3218
361/783
2013/0337269 A1* 12/2013 Ohtsuka ............. C08G 59/4014
428/418

(Continued)

FOREIGN PATENT DOCUMENTS

JP   2009-253138   10/2009
JP   2011-162615   8/2011

(Continued)

OTHER PUBLICATIONS

International Search Report of PCT application No. PCT/JP2015/004190 dated Oct. 27, 2015.

*Primary Examiner* — Hoa C Nguyen
*Assistant Examiner* — Amol Patel
(74) *Attorney, Agent, or Firm* — Greenblum & Bernstein, P.L.C.

(57) ABSTRACT

A prepreg includes a fiber base material and a thermosetting resin composition impregnated into the fiber base material. The thermosetting resin composition contains a thermosetting resin including an epoxy resin; a curing agent; an inorganic filler; and an acrylic acid ester copolymer having a weight average molecular weight of $10 \times 10^4$ or more and less than $45 \times 10^4$. A content of the inorganic filler is 150 parts by mass or more relative to a total of 100 parts by mass of the thermosetting resin and the curing agent. A content of the acrylic acid ester copolymer is more than 30 parts by mass and 90 parts by mass or less relative to the total of 100 parts by mass of the thermosetting resin and the curing agent.

6 Claims, 1 Drawing Sheet

(51) Int. Cl.
  *H05K 1/03* (2006.01)
  *B32B 15/08* (2006.01)
(52) U.S. Cl.
  CPC ........ *H05K 1/0373* (2013.01); *B32B 2457/08* (2013.01); *H05K 2201/0129* (2013.01)

(56) References Cited

U.S. PATENT DOCUMENTS

2014/0367150 A1  12/2014  Inoue et al.
2016/0007453 A1* 1/2016  Kawate ................ H05K 1/0298
                                                           361/783

FOREIGN PATENT DOCUMENTS

JP    2011162615 A  *  8/2011
JP    2014-070156      4/2014

* cited by examiner

# PREPREG, METAL-CLAD LAMINATED BOARD, AND PRINTED WIRING BOARD

FIELD OF THE INVENTION

The present invention relates to a prepreg and a metal-clad laminated board used for manufacturing a printed wiring board, and a printed wiring board.

DESCRIPTION OF THE RELATED ART

Printed wiring boards have been widely used in various fields including electronic devices, communication devices, calculators, and the like. Such printed wiring boards have been manufactured by stacking a necessary number of prepregs, further placing a metal foil on the stacked prepregs, subjecting the metal foil-placed prepregs to heat and pressure molding for integration in a laminated state to produce a metal-clad laminated board, and further patterning the metal foil on a surface of the metal-clad laminated board to form conductive wiring. Each of the prepregs can be obtained by impregnating a fiber base material such as glass cloth with a resin composition including predetermined materials.

In recent years, along with rapid development of electronic technology, reduction in thickness and a size of electronic devices have been proceeded, and along with reduction in thickness and a size, there have been a demand for a printed wiring board to be excellent in moldability and reduce occurrence of warping. In order to suppress the occurrence of warping in a printed wiring board, it is considered to be important to reduce a coefficient of thermal expansion (CTE) of an insulating layer constituting the printed wiring board.

Examples of a method for reduction in the coefficient of thermal expansion of the insulating layer include a method for containing at a high content ratio an inorganic filler, e.g., silica, in a resin composition constituting the insulating layer. A resin composition highly filled with an inorganic filler as described above, however, tends to deteriorate moldability, and may adversely affect quality of a laminated board and a printed wiring board. For example, in the manufacturing process of heat and pressure molding, streak unevenness may occur as a result of separation of a resin component from the filler both contained in a resin composition (prepreg), or thin spots may occur, where a resin is partially missing to form voids in an insulating layer.

Generally, a resin composition (prepreg) with a high inorganic filler content is effective for reduction in the CTE of a resin cured product (insulating layer), but a resin layer with which a fiber base material is impregnated embrittles to be likely to cause powder appearance on a surface of the prepreg or powder fall-off during side edge processing for the prepreg. That is, when a printed wiring board is manufactured by using a prepreg, the prepreg is used after cutting of the prepreg into a predetermined size or cutting-off of an unnecessary edge of the prepreg. Under the circumstances, a resin composition containing an inorganic filler at a high content ratio is likely to cause scattering of powder of the inorganic filler, resin pieces, and the like during cutting. Then, such powder, for example, attaches to a surface of a metal foil placed and laminated on a prepreg in a following molding process to possibly cause a defect by dent in a printed wiring board manufactured.

In contrast, a resin composition with a less inorganic filler content suppresses the powder fall-off described above, but an effect of sufficiently reducing the CTE cannot be obtained.

PTL 1 discloses a composite sheet containing 70 to 90% by weight of an inorganic filler in a resin component made of an epoxy resin and an acrylic resin having a weight average molecular weight of $45 \times 10^4$ to $85 \times 10^4$. In PTL 1, the coefficient of thermal expansion is decreased by increasing the content ratio of the inorganic filler, and flexibility of the composite sheet is improved by adding the acrylic resin to prevent occurrence of cutting dust during sheet cutting.

CITATION LIST

Patent Literature

PTL 1: Unexamined Japanese Patent Publication No. 2009-253138

SUMMARY OF THE INVENTION

The present invention provides a prepreg and a metal-clad laminated board that are capable of achieving both suppression of powder fall-off and reduction in a CTE while securing good moldability.

The prepreg according to the present invention includes a fiber base material and a thermosetting resin composition impregnated into the fiber base material. The thermosetting resin composition contains a thermosetting resin containing an epoxy resin; a curing agent; an inorganic filler; and an acrylic acid ester copolymer having a weight average molecular weight (Mw) of $10 \times 10^4$ or more and less than $45 \times 10^4$. A content of the inorganic filler is 150 parts by mass or more relative to a total of 100 parts by mass of the thermosetting resin and the curing agent. A content of the acrylic acid ester copolymer is more than 30 parts by mass and 90 parts by mass or less relative to the total of 100 parts by mass of the thermosetting resin and the curing agent.

The metal-clad laminated board according to the present invention includes an insulating layer being a cured product of the prepreg, and a metal foil provided on this insulating layer.

In the prepreg, the thermosetting resin composition contains 150 parts by mass or more of the inorganic filler relative to the total of 100 parts by mass of the thermosetting resin and the curing agent, and contains more than 30 parts by mass and 90 parts by mass or less of the acrylic acid ester copolymer having a Mw of $10 \times 10^4$ or more and less than $45 \times 10^4$. The prepreg of the present invention is highly filled with the inorganic filler as described so far to reduce the CTE of the cured product. In addition, because the acrylic acid ester copolymer is used in combination with the inorganic filler, stress is relieved by a modulus of elasticity of the acrylic acid ester copolymer. Therefore, the CTE of the cured product is further reduced as compared with a case in which only an inorganic filler is blended. Further, the powder fall-off during cutting or the like is also suppressed in spite of the thermosetting resin composition containing a great amount of the inorganic filler, because the content of the acrylic acid ester copolymer is in the above-described range. Further, occurrence of thin spots and the like can be suppressed to secure good moldability. Accordingly, in a metal-clad laminated board and a printed wiring board manufactured by using this prepreg, the CTE of an insulating layer is small so that occurrence of warping is suppressed, and further, a defect by dent attributing to the powder fall-off of the prepreg can also be prevented.

DETAILED DESCRIPTION OF THE PREFERRED EMBODIMENTS

Prior to description of an exemplary embodiment of the present invention, problems of a conventional composite sheet and a conventional prepreg are briefly described. The composite sheet described in PTL 1 does not include a fiber base material and is a product different from a prepreg including a fiber base material. Accordingly, characteristics required of moldability and the like during manufacture of a printed wiring board are also different. Further, the weight average molecular weight of the acrylic resin disclosed in PTL 1 is relatively large and a blending amount of the acrylic resin is relatively small. Therefore, it is considered to be difficult to solve both the problem of the moldability, such as thin spots, and the problem of the powder fall-off in the prepreg.

Figure 1:
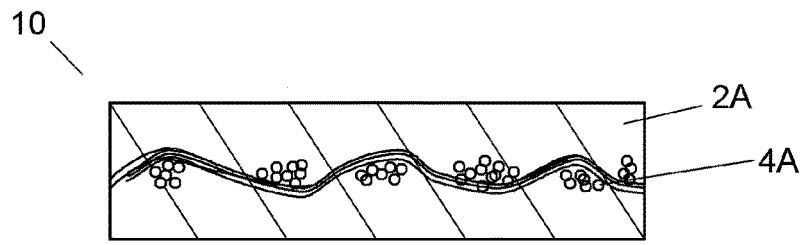
FIG. 1 is a schematic sectional view of a prepreg according to an exemplary embodiment of the present invention.

Hereinafter, a prepreg according to an exemplary embodiment of the present invention is described. FIG. 1 is a schematic sectional view of prepreg 10 according to the present exemplary embodiment. Prepreg 10 includes fiber base material 4A and thermosetting resin composition (hereinafter, a resin composition) 2A with which fiber base material 4A is impregnated.

Resin composition 2A contains a thermosetting resin containing an epoxy resin; a curing agent; an inorganic filler; and an acrylic acid ester copolymer having a weight average molecular weight (Mw) of $10 \times 10^4$ or more and less than $45 \times 10^4$. Fiber base material 4A is impregnated with resin composition 2A, and dried by heating to a semi-cured state (also referred to as a B stage state), to form prepreg 10 for a printed wiring board.

As the thermosetting resin, a resin including at least an epoxy resin can be used. The thermosetting resin may be a mixture including an epoxy resin and a thermosetting resin other than this epoxy resin, or may include only an epoxy resin.

The epoxy resin is not particularly limited as long as the epoxy resin is an epoxy resin used for forming various substrate materials for printed wiring boards. Specific examples of the epoxy resin include a naphthalene epoxy resin, a cresol novolac epoxy resin, a bisphenol A epoxy resin, a bisphenol F epoxy resin, a bisphenol S epoxy resin, an alicyclic epoxy resin, a linear aliphatic epoxy resin, a phenol novolac epoxy resin, an alkyl phenol novolac epoxy resin, an aralkyl epoxy resin, a bisphenol epoxy resin, a dicyclopentadiene epoxy resin, a tris(hydroxyphenyl)methane epoxy compound, an epoxidized condensate of a phenol and an aromatic aldehyde having a phenolic hydroxyl group, a diglycidyl-etherified bisphenol, a diglycidyl-etherified naphthalene diol, a glycidyl-etherified phenol, a diglycidyl-etherified alcohol, and a triglycidyl isocyanurate. In addition to the examples, there may also be used various types of glycidyl ether epoxy resins, glycidyl amine epoxy resins, glycidyl ester epoxy resins, and oxidized epoxy resins. Additionally, phosphorus-modified epoxy resins and the like can also be used. The epoxy resins may be used alone, or two or more of the epoxy resins may be used in combination. Particularly, an epoxy resin is preferably used, which has two or more epoxy groups in one molecule in terms of excellent curability.

When the thermosetting resin includes a thermosetting resin other than epoxy resins, a type of the thermosetting resin is not particularly limited. Examples of the thermosetting resin other than epoxy resins include a polyfunctional cyanate ester resin, a polyfunctional maleimide-cyanate ester resin, a polyfunctional maleimide resin, an unsaturated polyphenylene ether resin, a vinyl ester resin, a urea resin, a diallyl phthalate resin, a melanin resin, a guanamine resin, an unsaturated polyester resin, and a melamine-urea co-condensation resin. These thermosetting resins other than epoxy resins may be used alone, or two or more of these thermosetting resins can be used in combination.

As the curing agent, a curing agent generally used conventionally can be used, and may be appropriately selected according to a type of a thermosetting resin. The thermosetting resin includes an epoxy resin, and therefore the curing agent is not particularly limited as long as the curing agent can be used as a curing agent for the epoxy resin. Examples of the curing agent include a diamine-based curing agent and a bifunctional or polyfunctional curing agent. As the diamine-based curing agent, a primary amine and a secondary amine can be used. Examples of the bifunctional or polyfunctional curing agent include a bifunctional or polyfunctional phenol compound, an acid anhydride-based curing agent, dicyandiamide, and a polyphenylene ether compound (PPE). These curing agents may be used alone, or two or more of these curing agents may be used in combination.

Particularly, a bifunctional or polyfunctional phenol resin is preferably used as the curing agent. Examples of such a bifunctional or polyfunctional phenol resin include a novolac phenol resin, a naphthalene phenol resin, a cresol novolac resin, an aromatic hydrocarbon formaldehyde resin-modified phenol resin, a dicyclopentadiene phenol-addition type resin, a phenol aralkyl resin, a cresol aralkyl resin, a naphthol aralkyl resin, a biphenyl-modified phenol aralkyl resin, a phenol trimethylolmethane resin, a tetraphenylolethane resin, a naphthol novolac resin, a naphthol-phenol co-condensed novolac resin, a naphthol-cresol co-condensed novolac resin, a biphenyl-modified phenol resin, an aminotriazine-modified phenol resin, a biphenol, a glyoxal tetraphenol resin, a bisphenol A novolac resin, and a bisphenol F novolac resin. These bifunctional or polyfunctional phenol resins may be used alone, or two or more of these phenol resins may be used in combination.

Resin composition 2A contains an inorganic filler at a relatively high content ratio to reduce a CTE of a cured product of the resin composition. The specific content of the inorganic filler is 150 parts by mass or more relative to a total of 100 parts by mass of the thermosetting resin and the curing agent. In order to further reduce the CTE, 200 parts by mass or more is preferable. The more the inorganic filler is contained, the more the CTE can be expected to be reduced. However, a ratio of a resin component in resin composition 2A decreases as the content of the inorganic filler increases. Along with the decrease of a resin component, flowability of a molten resin during heat molding is deteriorated, for example, allowing thin spots and resin separation to likely occur, i.e., deterioration of the moldability, and the powder fall-off may possibly occur.

Accordingly, there is a limitation to an amount of the inorganic filler to be contained, and a general upper limit of the inorganic filler is considered to be about 400 parts by mass relative to 100 parts by mass of a resin component in a range of resin design of a conventional resin composition. Also in the present exemplary embodiment, an upper limit content of the inorganic filler is preferably 400 parts by mass or less, more preferably 360 parts by mass or less in terms of the moldability. In the present exemplary embodiment, however, resin composition 2A has an effect of improving the moldability by containing the acrylic acid ester copolymer, and therefore it may be possible to add more than 400 parts by mass, i.e., up to 450 to 500 parts by mass of the inorganic filler.

A type of the inorganic filler is not particularly limited. There can be used, for example, silica, barium sulfate, a silicon oxide powder, crushed silica, burned talc, zinc molybdate treated talc, barium titanate, titanium oxide, clay, alumina, mica, boehmite, zinc borate, zinc stannate, and other metal oxides and metal hydrates, and additionally, aluminum hydroxide, calcium carbonate, magnesium hydroxide, magnesium silicate, a short glass fiber, an aluminum borate whisker, and a silicon carbonate whisker. These inorganic fillers may be used alone, or two or more of these inorganic fillers may be used in combination. A shape and a size of the inorganic filler are not particularly limited, and for example, it is possible to use different sized inorganic fillers in combination. It is preferable to use in combination, for example, a filler having a particle size of 1 µm or more and a nano-order fine filler having a particle size of less than 1 µm in terms of raising a filling ratio of the inorganic filler. These inorganic fillers can be subjected to a surface treatment by, for example, a coupling agent.

The inorganic filler preferably contains silica in terms of reducing the CTE of a cured product of resin composition 2A and excellently securing other characteristics such as electrical performance, heat resistance, and thermal conductivity. In that case, a content of silica should be predominant relative to a total amount by mass of the inorganic filler, and particularly, the content is preferably 80% by mass or more.

Resin composition 2A contains an acrylic acid ester copolymer having a Mw of $10 \times 10^4$ or more and less than $45 \times 10^4$. Such an acrylic acid ester copolymer exerts an action of relieving expansion (expansion relief action) of a cured product of resin composition 2A when stress by thermal expansion is applied to the cured product. Generally, acrylic rubber particles and the like exist in a granular form in a resin composition. On the other hand, the acrylic acid ester copolymer has, in contrast to the acrylic rubber particles and the like, an indefinite shape and is mixed in a dissolved state with another resin component, when the acrylic acid ester copolymer is mixed with the other resin component in the organic solvent to prepare a resin varnish.

The acrylic acid ester copolymer is formed of a molecule including at least a repeating constitutional unit derived from an acrylic acid ester (acrylic acid ester unit). The repeating constitutional unit derived from an acrylic acid ester means a repeating constitutional unit formed through polymerization of an acrylic acid ester monomer. The acrylic acid ester copolymer includes, in a molecule, repeating constitutional units derived from a plurality of different acrylic acid esters, and may further include a repeating constitutional unit derived from a monomer other than acrylic acid esters. Alternatively, the acrylic acid ester copolymer may include a molecule formed of repeating constitutional units derived from a plurality of different acrylic acid esters. The acrylic acid ester copolymer may include a repeating constitutional unit derived from one acrylic acid ester, and a repeating constitutional unit derived from a monomer other than this acrylic acid ester.

A substituent directly bound to carbon of an ester bond in the acrylic acid ester is an alkyl group or a substituted alkyl group. In the substituted alkyl group, any one of hydrogen atoms in the alkyl group is substituted by another functional group. The alkyl group may be linear, branched, or alicyclic. In addition, the substituent may be aromatic. Specific examples of the acrylic acid ester include methyl acrylate, ethyl acrylate, propyl acrylate, isopropyl acrylate, butyl acrylate, isobutyl acrylate, t-butyl acrylate, pentyl acrylate, hexyl acrylate, cyclohexyl acrylate, octyl acrylate, decyl acrylate, lauryl acrylate, and benzyl acrylate. The acrylic acid ester, however, is not limited to these examples.

An example of the monomer other than acrylic acid esters is acrylonitrile. In addition to acrylonitrile, examples of the monomer other than acrylic acid esters include vinyl-based monomers other than acrylic acid esters, such as acrylamide, acrylic acid, methacrylic acid, a methacrylic acid ester, styrene, ethylene, propylene, and butadiene. The acrylic acid ester copolymer may include repeating constitutional units derived from two or more different monomers other than acrylic acid esters.

Repeating constitutional units constituting the acrylic acid ester copolymer may be arranged randomly or may constitute blocks according to the same repeating constitutional unit. That is, the acrylic acid ester copolymer may be a random copolymer or a block copolymer. The acrylic acid ester copolymer may also be a branched graft copolymer or a crosslinked polymer as long as the effects of the acrylic acid ester copolymer are not inhibited.

The acrylic acid ester copolymer can be obtained by, for example, radical polymerization of a predetermined monomer. The method for manufacture the acrylic acid ester copolymer, however, is not limited to such a method.

The acrylic acid ester copolymer may further have a functional group on a terminal, a side chain, or a main chain of a polymer molecule. The functional group is preferably a functional group that has reactivity particularly with at least either one of the epoxy resin and the curing agent.

Examples of such a functional group include an epoxy group, a hydroxyl group, a carboxyl group, an amino group, and an amide group. Bonding of the functional group to the acrylic acid ester copolymer, for example, enables the acrylic acid ester copolymer to react with another component included in resin composition 2A and thus be integrated into a curing structure of the thermosetting resin. Therefore, performance such as heat resistance, compatibility, and chemical resistance is improved. Among the functional groups exemplified above, the epoxy group is particularly preferable. A plurality of functional groups may be included in one polymer molecule. A state of having a functional group as described above is sometimes referred to as being modified by a functional group as described above. For example, a state of having an epoxy group is sometimes referred to as epoxy modified.

Particularly, the acrylic acid ester copolymer preferably has a molecular structure exhibiting rubber elasticity. In this case, the effect of the expansion relief action can be further increased. For example, an acrylic acid ester copolymer including a repeating constitutional unit derived from butyl acrylate and a repeating constitutional unit derived from acrylonitrile exhibits rubber elasticity. In addition, an acrylic acid ester copolymer including a repeating constitutional unit derived from butadiene also exhibits rubber elasticity.

The acrylic acid ester copolymer soluble in an organic solvent is mixed in an organic solvent with another component in resin composition 2A to prepare a resin varnish so that the acrylic acid ester copolymer is uniformly mixed together with the other resin component soluble in the solvent. As this acrylic acid ester copolymer (hereinafter, an acrylic resin), a solid acrylic resin may be used by dissolving the solid acrylic resin in an organic solvent when a varnish is prepared, or a liquid acrylic resin dissolved in an organic solvent in advance may be used. The acrylic resin is dissolved in an organic solvent and is uniformly mixed together with another resin component in this manner so that the expansion relief action is likely to function. Further, separation of a resin component from a filler in a flow state during heat molding is considered to be easily suppressed. Examples of the organic solvent include ketone solvents such as acetone, methyl ethyl ketone, and cyclohexanone, aromatic solvents such as toluene and xylene, and ester solvents such as ethyl acetate. These organic solvents may be used alone, or two or more of these organic solvents may be used in combination.

Resin composition 2A contains the acrylic acid ester copolymer so that viscosity of resin composition 2A is easily controlled appropriately. Therefore, in a substrate material (prepreg 10 or metal-clad laminated board 20 described later) formed from resin composition 2A, separation of a resin component derived from resin composition 2A, from the inorganic filler is less likely to occur, resulting in good moldability. Resin composition 2A containing the acrylic acid ester copolymer also enables reduction in the CTE of the prepreg. This is because the expansion relief action brought by the acrylic acid ester copolymer functions so that thermal expansion is absorbed by the acrylic acid ester copolymer.

The acrylic acid ester copolymer has a Mw of $10 \times 10^4$ or more and less than $45 \times 10^4$, preferably $10 \times 10^4$ or more and $35 \times 10^4$ or less. The Mw of the acrylic acid ester copolymer in this range enables the acrylic acid ester copolymer to be blended in an amount of more than 30 parts by mass relative to the total of 100 parts by mass of the thermosetting resin and the curing agent so that the good moldability can be secured, as described later. With this composition, it is possible to achieve both the suppression of the powder fall-off through cutting of prepreg 10 and the reduction in the CTE of a cured product of resin composition 2A while the good moldability is secured. Further, this composition easily enables a suitable balance among solubility of the acrylic acid ester copolymer in an organic solvent, a blending amount of the acrylic acid ester copolymer, and adjustment of melt viscosity of resin composition 2A. As described above, use of an acrylic acid ester copolymer having a relatively small molecular weight enables suppression of excessive rise in the melt viscosity of resin composition 2A even when the resin composition contains a great amount of the inorganic filler, as compared with a case of using an acrylic acid ester copolymer having a relatively large molecular weight, i.e., $45 \times 10^4$ or more. If the acrylic acid ester copolymer has a Mw of $45 \times 10^4$ or more, for example, thin spots, may possibly occur, deteriorating the moldability when the blending amount of the acrylic acid ester copolymer is increased. Therefore, there is a limit for increasing the blending amount of the acrylic acid ester copolymer, making it difficult to achieve both the reduction in the CTE and securement of the moldability. On the other hand, if the acrylic acid ester copolymer has a Mw of less than $10 \times 10^4$, elasticity brought by the acrylic acid ester copolymer may possibly decrease, leading to decreased contribution to the reduction in the CTE. Further, the effect of preventing the power fall-off in prepreg 10 may not possibly be sufficiently obtained. In the meantime, the Mw mentioned here refers to, for example, a value, in terms of polystyrene, measured by gel permeation chromatography.

Resin composition 2A may contain another component as necessary as well as the thermosetting resin, the curing agent, the inorganic filler, and the acrylic acid ester copolymer as long as the effects of the present invention are not inhibited. As the other component, there may be blended, for example, an organic solvent for dilution, a curing accelerator such as imidazole, an antioxidant, a wetting and dispersing agent and a coupling agent for improving mixability of the inorganic filler, a photostabilizer, a viscosity modifier, a flame retardant, a coloring agent, and an antifoaming agent. As the organic solvent for dilution, there is used, for example, ketone solvents such as acetone, methyl ethyl ketone, and cyclohexanone, aromatic solvents such as toluene and xylene, and nitrogen-containing solvents such as dimethylformamide.

Resin composition 2A can be prepared by blending in an organic solvent the thermosetting resin including the epoxy resin, the curing agent, the inorganic filler, the acrylic acid ester copolymer, and another component, such as an additive, which is appropriately added as necessary.

The content of the acrylic acid ester copolymer is more than 30 parts by mass and 90 parts by mass or less relative to the total of 100 parts by mass of the thermosetting resin and the curing agent. Generally, there is a trade-off relationship in which as the content of the inorganic filler in the resin composition increases, the CTE of a cured product can be reduced while the powder fall-off is likely to occur, as described above. Therefore, there is a limit for achieving both the reduction in the CTE and the suppression of the powder fall-off only by using the inorganic filler as means for reduction in the CTE. In contrast, in the present exemplary embodiment, the resin composition contains the inorganic filler and the acrylic acid ester copolymer in the content ranges described above so that further reduction in the CTE can be realized by a synergistic effect of the inorganic filler and the acrylic acid ester copolymer. Simultaneously, the powder fall-off can also be suppressed even when the inorganic filler is contained at a high content of 150 parts by mass or more. If the acrylic acid ester copolymer has a content of 30 parts by mass or less, the effect of suppressing the powder fall-off of the prepreg may possibly deteriorate, and the contribution to the reduction in the CTE also decreases. On the other hand, if the acrylic acid ester copolymer has a content of more than 90 parts by mass, for example, thin spots during molding may possibly occur.

Prepreg 10 can be formed by impregnating fiber base material 4A with resin composition 2A and drying the fiber base material by heating to a semi-cured state (B stage state). Temperature conditions and a period for making the semi-cured state can be set to, for example, 120° C. to 190° C. and 3 to 15 minutes.

Fiber base material 4A is not particularly limited, and there can be used a base material such as a plain fabric woven with warp and weft perpendicularly to each other. There can be used, for example, woven cloth of an inorganic fiber, such as glass cloth, and a fiber base material made of an organic fiber, such as aramid cloth and polyester cloth. Thickness of fiber base material 4A is not particularly limited but preferably ranges from 10 μm to 200 μm.

Figure 2:
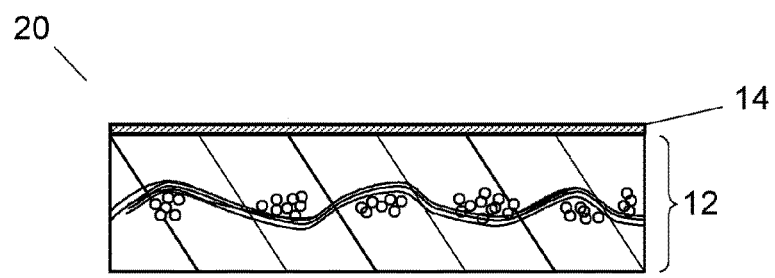
FIG. 2 is a schematic sectional view showing an example of a metal-clad laminated board according to the exemplary embodiment of the present invention.

Next, a metal-clad laminated board according to the present exemplary embodiment is briefly described. FIG. 2 is a schematic sectional view showing an example of metal-clad laminated board 20 according to the present exemplary embodiment.

Metal-clad laminated board 20 can be produced by placing metal foil 14 on both sides or one side of prepreg 10 or a stack of a plurality of prepregs 10, subjecting the metal foil-placed prepreg(s) to heat and pressure molding for integration in a laminated state. That is, metal-clad laminated board 20 includes insulating layer 12 being a cured product of prepreg 10, and metal foil 14 provided on insulating layer 12. As metal foil 14, for example, a copper foil can be used. Metal-clad laminated board 20 can be molded by heating and pressing a laminate of prepreg(s) 10 and metal foil 14 with, for example, a multistage vacuum press or a double belt.

Prepreg 10 and metal-clad laminated board 20 that are formed as described above are formed from resin composition 2A to have a low CTE and further, less likely to cause the powder fall-off, as described above. Therefore, such prepreg 10 is less likely to cause warping. Further, neither the separation of a resin component from the inorganic filler (resin separation) nor thin spots are also likely to occur, and powder of a resin component and the inorganic filler during cutting are hardly scattered. Therefore, the prepreg and the metal-clad laminated board can effectively be used as a substrate material to produce a high performance printed wiring board having no defect by dent mainly attributed to attachment of powder.

Figure 3:
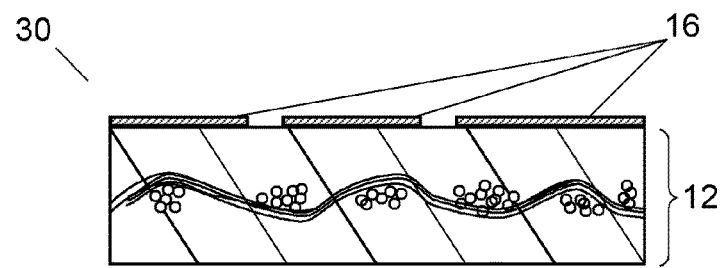
FIG. 3 is a schematic sectional view showing an example of a printed wiring board according to the exemplary embodiment of the present invention.

Next, a printed wiring board according to the present exemplary embodiment is briefly described. FIG. 3 is a schematic sectional view showing an example of printed wiring board 30 according to the present exemplary embodiment.

Printed wiring board 30 is formed by providing conductive pattern 16 through processing of metal foil 14 of metal-clad laminated board 20. That is, printed wiring board 30 includes insulating layer 12 being a cured product of prepreg 10, and conductive pattern 16 provided on insulating layer 12. Conductive pattern 16 can be formed by, for example, a subtractive method. Then, a semiconductor element can be mounted on printed wiring board 30 and sealed to manufacture a package such as a fine pitch ball grid array (FBGA). Alternatively, through use of such a package as a sub package, a package such as a package on package (PoP) can also be manufactured by laminating a plurality of sub packages.

Printed wiring board 30 is formed of a substrate material that has a low CTE and is less likely to cause the powder fall-off. Therefore, in printed wiring board 30, warping is less likely to occur and a defect by dent is hardly observed.

Hereinafter, the effects of the present exemplary embodiment are described with reference to more specific examples.

Prepared are a thermosetting resin, a curing agent, an inorganic filler, an acrylic acid ester copolymer, and additives (a dispersing agent, a coupling agent, and an antioxidant) mentioned below, and these raw materials are mixed according to blending amounts (part by mass) shown in Tables 1, 2 to prepare resin varnishes (thermosetting resin compositions). The details of the raw materials are as described below.

<Thermosetting Resin>
Polyfunctional epoxy resin ("EPPN-502H" manufactured by Nippon Kayaku Co., Ltd.)
<Curing Agents>
Naphthalene skeleton phenol resin ("HPC-9500" manufactured by DIC Corporation)
Phenol novolac resin ("TD-2090" manufactured by DIC Corporation) Both the two curing agents are a polyfunctional phenol resin.
<Acrylic Acid Ester Copolymers>
Acrylic acid ester copolymer (Epoxy modified-acrylic resin, "SG-P3mw1," Mw: $25 \times 10^4$, manufactured by Nagase ChemteX Corporation)
Acrylic acid ester copolymer (Epoxy modified-acrylic resin, "SG-P3," Mw: $85 \times 10^4$, manufactured by Nagase ChemteX Corporation)
<Inorganic Fillers>
Silica A ("SC-4500SQ" manufactured by Admatechs Company Limited)
Silica B ("SC-2500SEJ" manufactured by Admatechs Company Limited)
Magnesium hydroxide ("MGZ-613," manufactured by Sakai Chemical Industry Co., Ltd.)
<Additives>
Dispersing agent ("W903" manufactured by BYK Japan K.K.)
Coupling agent ("KBE-9007" manufactured by Shin-Etsu Chemical Co., Ltd.)
Antioxidant ("HCA" manufactured by SANKO CO., LTD.)

Glass cloth ("2117," thickness: 95 μm, manufactured by Nitto Boseki Co., Ltd.) as a fiber base material is impregnated with each of the resin varnishes prepared according to blending composition shown in Tables 1, 2 so that thickness of the glass cloth after curing is 100 μm, and is then dried by heating at 145° C. for 2 minutes to a semi-cured state to manufacture a prepreg.

Four sheets of the prepreg are stacked, a copper foil (thickness: 12 μm) as a metal foil is laminated on both sides of the prepreg stack, and is molded under vacuum conditions by heating at 200° C. for 120 minutes while a pressure of 6.0 MPa is applied. A copper-clad laminated board as a metal-clad laminated board is manufactured in this manner.

Prepreg samples or copper-clad laminated board samples produced in this manner are evaluated for various physical properties (powder fall-off, thin spots and CTE). Tables 1, 2 also show results of the evaluation of the physical properties of each sample.

The evaluation of the various physical properties was conducted by methods mentioned below.

<Powder Fall-Off>
Visual observation is conducted for each of the prepreg samples to confirm presence or absence of the powder fall-off when the prepreg sample is cut with a cutting instrument.

<Thin Spots>
A copper foil on a surface of each of the copper-clad laminated board samples is removed by etching to confirm presence or absence of thin spots on the surface by visual observation, and a copper-clad laminated board sample having no thin spot is determined to be "OK," while a copper-clad laminated board sample having thin spots is determined to be "NG."

(CTE (Tension))
A longitudinal coefficient of thermal expansion is measured at a temperature lower than a glass transition temperature of a resin cured product in an insulating layer with respect to a specimen for evaluation, which is obtained by removing by etching a copper foil on a surface of each of the copper-clad laminated board samples. Measurement is conducted conforming to a thermo-mechanical analysis (TMA) method in accordance with JIS C 6481 (corresponding to IPC-TM-650 2.4.24.5), and a thermal analysis device ("TMA/SS6000" manufactured by Seiko Instruments Inc.) is used for the measurement.

TABLE 1

Blending conditions and physical property evaluation

| | Raw materials | Unit | EA | EB | EC | ED |
|---|---|---|---|---|---|---|
| Thermo-setting resin | Polyfunctional epoxy resin | Part by mass | 58 | 58 | 58 | 58 |
| Curing agents | Naphthalene skeleton phenol resin | Part by mass | 21 | 21 | 21 | 21 |
| | Phenol novolac resin | Part by mass | 22 | 22 | 22 | 22 |
| Acrylic resins | Acrylic acid ester copolymer Mw: $25 \times 10^4$ | Part by mass | 40 | 50 | 80 | 40 |
| | Acrylic acid ester copolymer Mw: $85 \times 10^4$ | Part by mass | — | — | — | — |
| Inorganic fillers | Silica A | Part by mass | 184 | 184 | 184 | |
| | Silica B | Part by mass | 56 | 56 | 56 | 170 |
| | Magnesium hydroxide | Part by mass | 10 | 10 | 10 | 30 |
| Additives | Dispersing agent | phr | 0.4 | 0.4 | 0.4 | 0.4 |
| | Coupling agent | phr | 2.3 | 2.3 | 2.3 | 2.3 |
| | Antioxidant | phr | 0.5 | 0.5 | 0.5 | 0.5 |
| Total amount of inorganic fillers | | Part by mass | 250 | 250 | 250 | 200 |
| Content ratio of silica | | % | 96.0 | 96.0 | 96.0 | 85.0 |
| Powder fall-off | | | None | None | None | None |
| Thin spots | | | OK | OK | OK | OK |
| CTE | | ppm/°C. | 5.5 | 5.0 | 3.5 | 7.0 | phr: per hundred resin (part by mass relative to 100 parts by mass of resin)

TABLE 2

Blending conditions and physical property evaluation

| | Raw materials | Unit | CA | CB | CC | CD | CE |
|---|---|---|---|---|---|---|---|
| Thermo-setting resin | Polyfunctional epoxy resin | Part by mass | 58 | 58 | 58 | 58 | 58 |
| Curing agents | Naphthalene skeleton phenol resin | Part by mass | 21 | 21 | 21 | 21 | 21 |
| | Phenol novolac resin | Part by mass | 22 | 22 | 22 | 22 | 22 |
| Acrylic resins | Acrylic acid ester copolymer Mw: $25 \times 10^4$ | Part by mass | 30 | 100 | — | — | — |
| | Acrylic acid ester copolymer Mw: $85 \times 10^4$ | Part by mass | — | — | 30 | — | — |
| Inorganic fillers | Silica A | Part by mass | 184 | 184 | 184 | 184 | 170 |
| | Silica B | Part by mass | 56 | 56 | 56 | 56 | 30 |
| | Magnesium hydroxide | Part by mass | 10 | 10 | 10 | 10 | 10 |
| Additives | Dispersing agent | phr | 0.4 | 0.4 | 0.4 | 0.4 | 0.4 |
| | Coupling agent | phr | 2.3 | 2.3 | 2.3 | 2.3 | 2.3 |
| | Antioxidant | phr | 0.5 | 0.5 | 0.5 | 0.5 | 0.5 |
| Total amount of inorganic fillers | | Part by mass | 250 | 250 | 250 | 250 | 200 |
| Content ratio of silica | | % | 96.0 | 96.0 | 96.0 | 96.0 | 85.0 |
| Powder fall-off | | | Yes | None | None | Yes | Yes |
| Thin spots | | | OK | NG | NG | OK | OK |
| CTE | | ppm/°C. | 6.5 | — | 6.5 | 8.5 | 9.0 |

Samples EA to EC shown in Table 1 all have CTE values smaller than a CTE value of Sample CD shown in Table 2, and neither the powder fall-off nor thin spots are observed in Samples EA to EC. Sample ED also has a CTE value smaller than a CTE value of Sample CE, and neither the powder fall-off nor thin spots are observed in Sample ED.

When Samples EA to EC having the same composition except the acrylic acid ester copolymer are particularly compared with each other, it is understood to be more effective for the reduction in the CTE as the content of the acrylic acid ester copolymer increases.

On the other hand, in Sample CA, although thin spots are not observed, the powder fall-off is observed and the CTE is high due to a small content of the acrylic acid ester copolymer. In Sample CB, although the powder fall-off is not observed, thin spots are observed and the CTE cannot be measured because a good sample piece cannot be obtained due to a large content of the acrylic acid ester. In Sample CC that includes an acrylic acid ester copolymer having a large weight average molecular weight, the powder fall-off is not observed while thin spots occur.

As described above, it is understood that Samples EA to EC can maintain a low CTE while suppressing the powder fall-off because the prepreg and the metal-clad laminated board are formed from resin composition 2A according to the present exemplary embodiment. Therefore, warping is less likely to occur so that a high quality printed wiring board without a defect by dent can be produced.

A printed wiring board can be produced from a substrate material (a prepreg and a metal-clad laminated board including the prepreg) according to the present invention. This printed wiring board is formed of the substrate material that has a low CTE and is less likely to cause powder fall-off. Therefore, in the printed wiring board, warping is less likely to occur and a defect by dent is hardly observed. Accordingly, the present invention is more compatible with, for example, electronic devices for reduction in thickness and a size. Therefore, the printed wiring board formed in this manner can be used for various applications such as communication or measuring devices, office automation equipment, and peripheral terminal equipment of the devices and the equipment.

The invention claimed is:
1. A prepreg comprising:
a fiber base material; and
a thermosetting resin composition impregnated into the fiber base material,
the thermosetting resin composition containing:
a thermosetting resin including an epoxy resin;
a curing agent;

an inorganic filler; and
an acrylic acid ester copolymer having a weight average molecular weight of $10 \times 10^4$ or more and less than $45 \times 10^4$,
a content of the inorganic filler being 150 parts by mass or more relative to a total of 100 parts by mass of the thermosetting resin and the curing agent, and
a content of the acrylic acid ester copolymer being more than 30 parts by mass and 90 parts by mass or less relative to the total of 100 parts by mass of the thermosetting resin and the curing agent.

2. The prepreg according to claim 1, wherein the acrylic acid ester copolymer has a functional group having reactivity with at least either one of the epoxy resin and the curing agent.

3. The prepreg according to claim 1, wherein the inorganic filler contains 80% by mass or more of silica.

4. The prepreg according to claim 1, wherein the curing agent is a bifunctional or polyfunctional phenol resin.

5. A metal-clad laminated board comprising:
an insulating layer being a cured product of the prepreg according to claim 1; and
a metal foil provided on the insulating layer.

6. A printed wiring board comprising:
an insulating layer being a cured product of the prepreg according to claim 1; and
a conductive pattern provided on the insulating layer.

* * * * *